United States Patent
Nagasaki et al.

(10) Patent No.: US 10,094,529 B2
(45) Date of Patent: Oct. 9, 2018

(54) WAVELENGTH CONVERSION MEMBER INCLUDING PHOSPHOR THAT CONVERTS LIGHT FROM SEMICONDUCTOR LIGHT-EMITTING ELEMENT INTO LONGER-WAVELENGTH LIGHT

(71) Applicant: Panasonic Intellectual Property Management Co., Ltd., Osaka (JP)

(72) Inventors: Yoshihisa Nagasaki, Osaka (JP); Takahiro Hamada, Osaka (JP); Kazuma Mima, Hyogo (JP); Yukihiko Sugio, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 39 days.

(21) Appl. No.: 15/468,183

(22) Filed: Mar. 24, 2017

(65) Prior Publication Data

US 2017/0307163 A1    Oct. 26, 2017

(30) Foreign Application Priority Data

Apr. 20, 2016    (JP) .................. 2016-084523

(51) Int. Cl.
  *F21S 41/16*  (2018.01)
  *F21S 8/10*   (2006.01)
  (Continued)

(52) U.S. Cl.
  CPC ............ *F21S 48/1145* (2013.01); *B60Q 1/04* (2013.01); *C09K 11/025* (2013.01);
  (Continued)

(58) Field of Classification Search
  CPC .. F21S 41/14; F21S 41/16; F21S 41/25; F21S 48/1145; H01L 33/32; H01L 33/507;
  (Continued)

(56) References Cited

U.S. PATENT DOCUMENTS

2012/0087105 A1* 4/2012 Dai ............... F21V 3/0481
                                                362/84
2012/0106189 A1   5/2012 Takahashi et al.
(Continued)

FOREIGN PATENT DOCUMENTS

EP      3147955 A1      3/2017
JP      2012-089316     5/2012
(Continued)

OTHER PUBLICATIONS

The Extended European Search Report dated Aug. 3, 2017 for the related European Patent Application No. 17164498.2.

*Primary Examiner* — Joseph L Williams
*Assistant Examiner* — Jose M Diaz
(74) *Attorney, Agent, or Firm* — McDermott Will & Emery LLP

(57) ABSTRACT

A wavelength conversion member, comprises: a substrate; a first wavelength conversion layer on the substrate, the first wavelength conversion layer containing a first phosphor and a first matrix; and a second wavelength conversion layer containing a second phosphor, first inorganic particles, and a second matrix. The first phosphor and the second phosphor convert at least part of the excitation light incident on the second main surface into first light having longer wavelengths than the excitation light. The first light is emitted from the second main surface of the second wavelength conversion layer. A volume Vp1 of the first phosphor, a volume Vw1 of the first wavelength conversion layer, a volume Vp2 of the second phosphor, and a volume Vw2 of the second wavelength conversion layer satisfy Vp1/Vw1>Vp2/Vw2.

20 Claims, 2 Drawing Sheets

(51) Int. Cl.
*F21S 41/14* (2018.01)
*B60Q 1/04* (2006.01)
*C09K 11/02* (2006.01)
*C09K 11/77* (2006.01)
*H01L 33/00* (2010.01)
*H01L 33/32* (2010.01)
*C09K 11/62* (2006.01)
*H01L 33/50* (2010.01)
*H01S 5/00* (2006.01)
*F21S 41/25* (2018.01)
*F21S 45/47* (2018.01)

(52) U.S. Cl.
CPC .......... *C09K 11/7774* (2013.01); *F21S 41/14* (2018.01); *F21S 41/16* (2018.01); *H01L 33/0045* (2013.01); *H01L 33/32* (2013.01); *H01L 33/504* (2013.01); *H01L 33/507* (2013.01); *C09K 11/62* (2013.01); *C09K 11/7728* (2013.01); *F21S 41/25* (2018.01); *F21S 45/47* (2018.01); *H01L 33/501* (2013.01); *H01L 33/502* (2013.01); *H01L 33/508* (2013.01); *H01L 2933/0091* (2013.01); *H01S 5/005* (2013.01)

(58) Field of Classification Search
CPC ... H01L 33/504; H01L 33/501; H01L 33/502; H01L 33/508; H01L 33/0045; C09K 11/7774; C09K 11/025; C09K 11/7728; C09K 11/62; F21K 9/56; F21K 9/64
See application file for complete search history.

(56) References Cited

U.S. PATENT DOCUMENTS

| | | | |
|---|---|---|---|
| 2014/0071683 | A1 | 3/2014 | Hamada et al. |
| 2014/0072812 | A1 | 3/2014 | Hamada et al. |
| 2015/0102722 | A1 | 4/2015 | Ohbayashi et al. |
| 2017/0307968 | A1* | 10/2017 | Nagasaki .............. F21S 41/143 |

FOREIGN PATENT DOCUMENTS

| | | |
|---|---|---|
| JP | 2012-099280 | 5/2012 |
| JP | 2015-005650 | 1/2015 |
| JP | 2015-050124 | 3/2015 |
| JP | 2015-097256 | 5/2015 |
| JP | 2016-027613 A | 2/2016 |
| WO | 2013/172025 | 11/2013 |

* cited by examiner

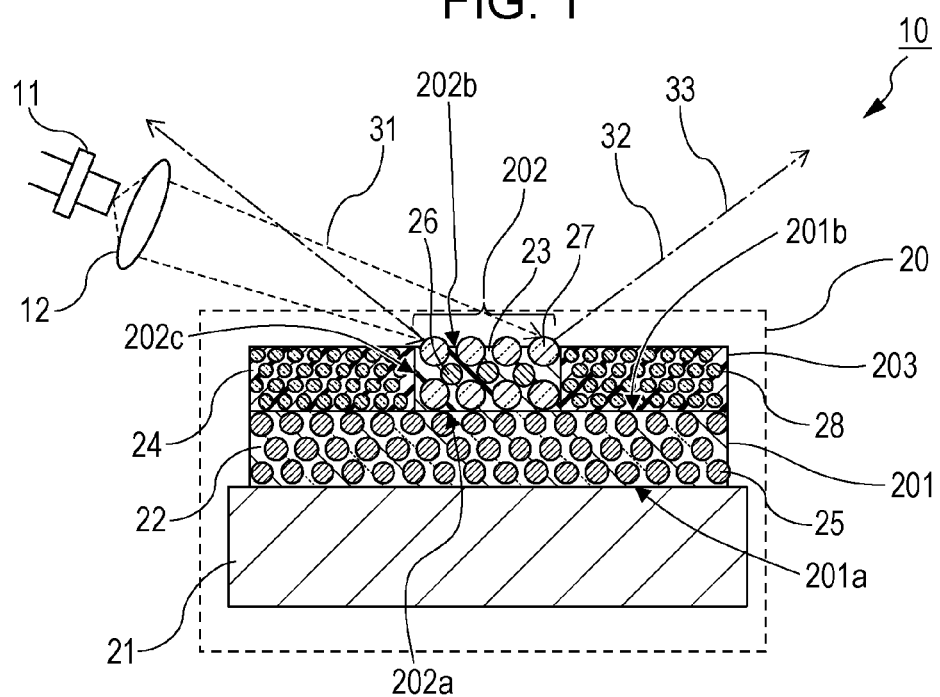
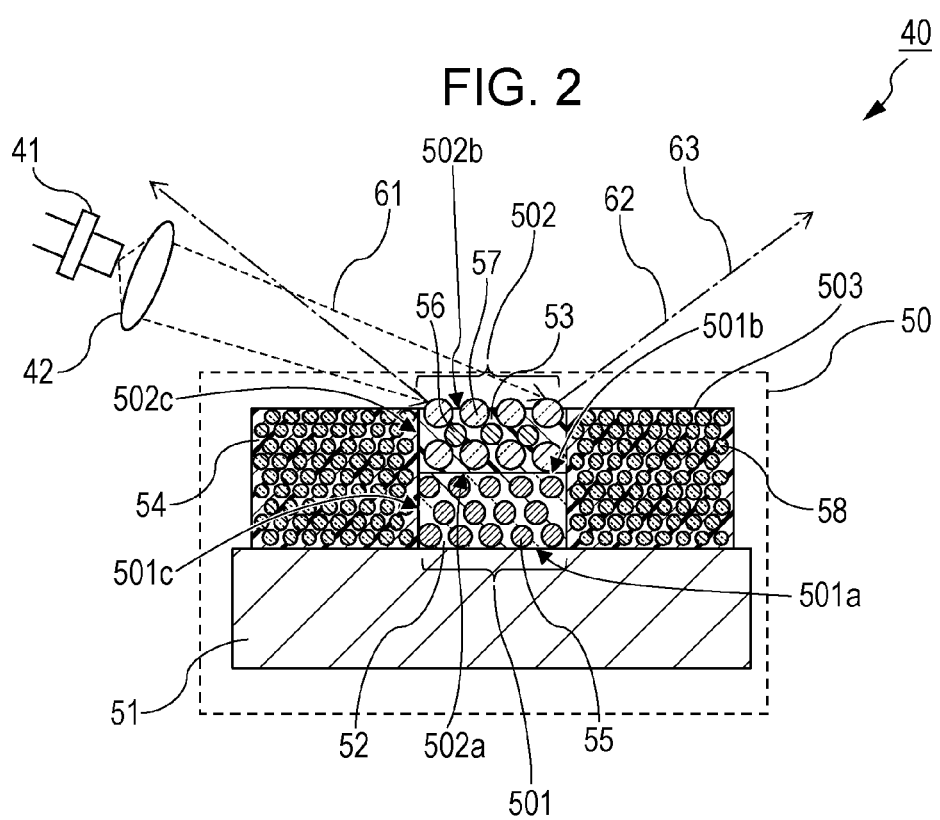

WAVELENGTH CONVERSION MEMBER INCLUDING PHOSPHOR THAT CONVERTS LIGHT FROM SEMICONDUCTOR LIGHT-EMITTING ELEMENT INTO LONGER-WAVELENGTH LIGHT

BACKGROUND

1. Technical Field

The present disclosure relates to a wavelength conversion member including a phosphor that converts light from a semiconductor light-emitting element into longer-wavelength light, a light source including the wavelength conversion member, and a vehicle headlamp including the light source.

2. Description of the Related Art

Hitherto, a vehicle lighting device that generates light has been reported, the vehicle lighting device including a semiconductor light-emitting element that generates light, a phosphor spaced apart from the semiconductor light-emitting element, a first optical member that collects light generated by the semiconductor light-emitting element into a phosphor, and a second optical member that has an optical center at a position where the phosphor is provided and that sends light generated by the phosphor in response to light collected by the first optical member to the outside of the lighting device (see Japanese Unexamined Patent Application Publication No. 2012-99280).

Japanese Unexamined Patent Application Publication No. 2012-99280 discloses that the luminous efficiency is improved by allowing a spot area of excitation light on a surface of the phosphor, the excitation light being emitted from the semiconductor light-emitting element, to be smaller than the area of the surface of the phosphor.

SUMMARY

One non-limiting and exemplary embodiment provides a wavelength conversion member that inhibits a reduction in luminous efficiency.

In one general aspect, the techniques disclosed here feature a wavelength conversion member including a substrate, a first wavelength conversion layer, and a second wavelength conversion layer. The first wavelength conversion layer is located on the substrate and contains a first phosphor and a first matrix. The second wavelength conversion layer has a first main surface facing the first wavelength conversion layer and a second main surface on which excitation light from a semiconductor light-emitting element is incident, and contains a second phosphor, first inorganic particles, and a second matrix. The first phosphor and the second phosphor convert the excitation light incident on the second main surface into first light having longer wavelengths than the excitation light. The first light emits from the second main surface of the second wavelength conversion layer. A volume Vp1 of the first phosphor, a volume Vw1 of the first wavelength conversion layer, a volume Vp2 of the second phosphor, and a volume Vw2 of the second wavelength conversion layer satisfy Vp1/Vw1>Vp2/Vw2.

The use of the wavelength conversion member disclosed here inhibits the reduction in luminous efficiency.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1 is a cross-sectional view schematically illustrating a structure of a light source according to a first embodiment;

FIG. 2 is a cross-sectional view schematically illustrating a structure of a light source according to a second embodiment;

DETAILED DESCRIPTION

Figure 3:
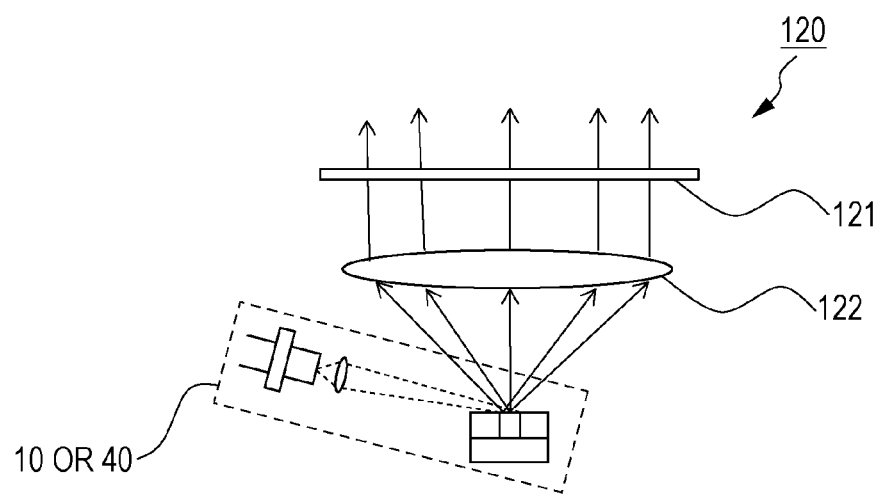
FIG. 3 schematically illustrates a structure of a vehicle headlamp according to a third embodiment.

In the related art, there has been a demand for a method for improving luminous efficiency, improving contrast between a light-emitting portion and a non-light-emitting portion, and easily adjusting an emission color at the time of manufacture in order to meet laws and regulations governing lighting devices for vehicles. The inventors have conducted intensive studies in order to provide a method for improving contrast between a light-emitting portion and a non-light-emitting portion and easily achieving a stable emission color without reducing luminous efficiency. According to the present disclosure, main wavelength conversion from excitation light to fluorescence or phosphorescence occurs in the first wavelength conversion layer. Thus, heat generated during the wavelength conversion can be efficiently dissipated toward a substrate to inhibit a reduction in luminous efficiency. Furthermore, it is possible to improve the contrast between the light-emitting portion and the non-light-emitting portion and easily adjust the emission color by the arrangement of a reflective layer around a second wavelength conversion layer and by the control of the thickness of the second wavelength conversion layer.

A wavelength conversion member according to an embodiment of the present disclosure includes a substrate, a first wavelength conversion layer, and a second wavelength conversion layer. The first wavelength conversion layer is located on the substrate and contains a first phosphor and a first matrix. The second wavelength conversion layer has a first main surface facing the first wavelength conversion layer and a second main surface on which excitation light from a semiconductor light-emitting element is incident. The second wavelength conversion layer contains a second phosphor, first inorganic particles, and a second matrix. The first phosphor and the second phosphor convert the excitation light incident from the second main surface into first light having longer wavelengths than the excitation light. The first light is emitted from the second main surface of the second wavelength conversion layer. A volume Vp1 of the first phosphor, a volume Vw1 of the first wavelength conversion layer, a volume Vp2 of the second phosphor, and a volume Vw2 of the second wavelength conversion layer satisfy Vp1/Vw1>Vp2/Vw2. The first light may be fluorescence or phosphorescence. The first phosphor may include phosphor particles. The second phosphor may also include phosphor particles. In the case that the first phosphor consists of first phosphor particles and the second phosphors consists of second phosphor particles, Vp1 and Vp2 are calculated as follows: Vp1 is the sum of the volumes of all first phosphor particles contained in the first wavelength conversion layer; and Vp2 is the sum of the volumes of all second phosphor particles contained in the second wavelength conversion layer.

The wavelength conversion member may further include a reflective layer that is located on at least one side face of the second wavelength conversion layer and that contains second inorganic particles and a third matrix. The volume Vp1 of the first phosphor may be equal to or more than 30% and less than or equal to 80% of the volume Vw1 of the first wavelength conversion layer. The volume Vp2 of the second phosphor may be equal to or more than 0.1% and less than or equal to 20% of the volume Vw2 of the second wavelength conversion layer. The first matrix may have a higher thermal conductivity than the second matrix. The first matrix may be zinc oxide. The second matrix may be a material having a siloxane bond.

A light source according to an embodiment of the present disclosure includes the semiconductor light-emitting element that emits the excitation light having a peak wavelength of 420 nm or more and 470 nm or less and the wavelength conversion member. A vehicle headlamp according to an embodiment of the present disclosure includes the light source and an exit optical system that guides light from the light source to the outside.

First Embodiment

FIG. 1 schematically illustrates a structure of a light source 10 according to a first embodiment of the present disclosure. The light source 10 at least includes a semiconductor light-emitting element 11 and a wavelength conversion member 20. The semiconductor light-emitting element 11 emits excitation light 31. The wavelength conversion member 20 receives the excitation light 31 and emits first light 32 having longer wavelengths than the excitation light 31 and diffusively reflected light 33 of the excitation light 31. The first light 32 is fluorescence or phosphorescence. The semiconductor light-emitting element 11 may be formed of a light-emitting diode (LED), a superluminescent diode (SLD), a laser diode (LD), or the like. For example, the semiconductor light-emitting element 11 in this embodiment is an LD. The semiconductor light-emitting element 11 may be formed of a single LD or a plurality of LD's optically coupled. The semiconductor light-emitting element 11 emits, for example, blue light. The blue light used in the present disclosure indicates light having a peak wavelength of 420 nm or more and 470 nm or less. The light source 10 further includes an entrance optical system 12 that may be located in an optical path of the excitation light 31 emitted from the semiconductor light-emitting element 11. The entrance optical system 12 includes, for example, a lens, a mirror, an optical fiber, or any combination thereof.

As described above, the wavelength conversion member 20 includes a surface on which excitation light from the semiconductor light-emitting element 11 is incident, and emits the first light 32 having longer wavelengths than the excitation light 31 from the surface and the diffusively reflected light 33 having the same wavelength as the excitation light 31 that has not been subjected to wavelength conversion. The wavelength conversion member 20 includes a first wavelength conversion layer 201 located on at least a substrate 21 and a second wavelength conversion layer 202 on the first wavelength conversion layer 201. The wavelength conversion member 20 further includes a reflective layer 203 located on the first wavelength conversion layer 201 and around the second wavelength conversion layer 202.

The first wavelength conversion layer 201 includes a first main surface 201a and a second main surface 201b. The first main surface 201a faces the substrate 21. The second main surface 201b is located opposite the first main surface 201a. The first wavelength conversion layer 201 at least contains a first phosphor 25 and a first matrix 22. The first phosphor 25 has a main function of partially converting the excitation light 31 into the first light 32. The material composition of the first phosphor 25 is not particularly limited. For example, the first phosphor 25 in this embodiment is an $(Y_{1-y}Gd_y)_3(Al_{1-z}Ga_z)_5O_{12}:Ce^{3+}$ [0≤y<1, z<1] phosphor. The first matrix 22 may be a transparent inorganic material, for example, glass, a silicone resin, an organic-inorganic hybrid material, $Al_2O_3$, or ZnO. For example, the first matrix 22 in this embodiment is ZnO.

In the case where ZnO is used as the first matrix 22, the first phosphor 25 may be sealed by, for example, the following method: (1) ZnO seed crystals are formed on the substrate 21 by vacuum deposition, and a layer consisting of only the first phosphor 25 is formed by, for example, a casting method on the ZnO seed crystals; (2) the substrate 21 with the seed crystals and the layer consisting of the first phosphor 25 is immersed in, for example, an aqueous zinc nitrate $(Zn(NO_3)_2)$ solution containing hexamethylenetetramine $(C_6H_{12}N_4)$; and (3) the temperature of the aqueous solution is set to 80° C. Thereby, ZnO is formed by liquid-phase deposition so as to surround the first phosphor 25. The ZnO serving as the first matrix 22 formed by this method has a thermal conductivity of 10 W/m·K.

The volume ratio of the first phosphor 25 in the first wavelength conversion layer 201 is preferably 30% or more and 80% or less. Note that, the "volume ratio of X in Y" in the present disclosure means the percentage of the volume of X, as compared to the volume of Y, which is taken as 100%. For example, the volume ratio of the first phosphor 25 in the first wavelength conversion layer 201 is 60% in this embodiment. When the volume ratio of the first phosphor 25 in the first wavelength conversion layer 201 is 30% or more, the contact area among particles of the first phosphor 25 is large, so that thermal conduction between the particles occurs easily. Thus, heat generated during the wavelength conversion is sufficiently dissipated to the substrate 21 to inhibit an increase in the temperature of the wavelength conversion member 20, thereby inhibiting a reduction in luminous efficiency. When the volume ratio of the first phosphor 25 in the first wavelength conversion layer 201 is 80% or less, the breaking or the like of the particles of the first phosphor 25 is inhibited. Thus, a reduction in luminous efficiency due to defects caused by the break is inhibited.

The phosphor is uniformly present in the wavelength conversion layer without regularity. Thus, the volume ratio of the phosphor in the wavelength conversion layer is substantially the same as the proportion of the cross-sectional area of the phosphor with respect to the cross-sectional area of the entire wavelength conversion layer in a cross section of the wavelength conversion layer. Thus, the proportion of the cross-sectional area is used for a method of measuring the volume ratio of a phosphor in a wavelength conversion layer. For example, a cross section of the wavelength conversion layer obtained by cross-section polisher processing (hereinafter, referred to as "CP processing") is observed with a scanning electron microscope (hereinafter, referred to as a "SEM") to calculate the proportion of the cross-sectional area of the phosphor with respect to the cross-sectional area of the entire wavelength conversion layer. The resulting proportion of the cross-sectional area is defined as the volume ratio of the phosphor in the wavelength conversion layer.

The first wavelength conversion layer 201 may contain inorganic particles, for example, $SiO_2$, $Al_2O_3$, or MgO, in a proportion lower than the volume ratio of the first phosphor 25, in addition to the first phosphor 25 and the first matrix 22. In this case, the scattering of the excitation light 31 and the first light 32 can be controlled.

The second wavelength conversion layer 202 includes a first main surface 202a and a second main surface 202b. The first main surface 202a faces the second main surface 201b of the first wavelength conversion layer 201. The second main surface 202b is located opposite the first main surface 202a. The second main surface 202b serves as a surface of the wavelength conversion member 20 on which the excitation light 31 is incident and also serves as a surface that emits the first light 32 and the diffusively reflected light 33. The first main surface 202a of the second wavelength conversion layer 202 lies on the side of the substrate 21. The second main surface 202b of the second wavelength conversion layer 202 lies on the opposite side of the substrate 21. The second wavelength conversion layer 202 at least includes a second phosphor 26, first inorganic particles 27, and a second matrix 23. The second phosphor 26 partially converts the excitation light 31 into the 32. The first inorganic particles 27 have the function of generating the diffusively reflected light 33 having the same wavelength as the excitation light 31.

The material composition of the second phosphor 26 is not particularly limited and may be the same as that of the first phosphor 25. For example, the second phosphor 26 in this embodiment is an $(Y_{1-y}Gd_y)_3(Al_{1-z}Ga_z)_5O_{12}:Ce^{3+}$ [$0 \leq y<1$, $0 \leq z<1$] phosphor. The material of the first inorganic particles 27 is preferably a transparent material that exhibits lower absorption of light in the visible region. Examples of the material of the first inorganic particles 27 may include $SiO_2$, $Al_2O_3$, MgO, ZnO, $TiO_2$, ZrO, $Ta_2O_5$, $Nb_2O_5$, BN, AlN, and $BaSO_4$. For example, the material of the first inorganic particles 27 in this embodiment is $SiO_2$. Examples of the second matrix 23 may include transparent inorganic materials, such as glass, silicone resins, organic-inorganic hybrid materials, $Al_2O_3$, and ZnO. For example, the second matrix 23 in this embodiment is a polysilsesquioxane, which is an organic-inorganic hybrid material having a siloxane bond.

When the polysilsesquioxane is used as the second matrix 23, the second phosphor 26 and the first inorganic particles 27 may be sealed by, for example, the following method: (1) the polysilsesquioxane that has been dissolved in a benzyl alcohol solvent, the second phosphor 26, and the first inorganic particles 27 are mixed together into a paste-like mixture; and (2) the paste-like mixture is applied by, for example, a screen printing method to the first wavelength conversion layer 201 and thermally cured. Thereby, the second matrix 23 including the second phosphor 26 and the first inorganic particles 27 sealed therein is formed. The polysilsesquioxane serving as the second matrix 23 formed by this method has a thermal conductivity of 1 W/m·K.

The volume ratio of the second phosphor 26 in the second wavelength conversion layer 202 is preferably lower than the volume ratio of the first phosphor 25 in the first wavelength conversion layer 201. More preferably, the volume ratio of the second phosphor 26 in the second wavelength conversion layer 202 is 0.1% or more and 20% or less. The volume ratio of the second phosphor 26 in the second wavelength conversion layer 202 may be, for example, 1%.

The first wavelength conversion layer 201 converts the excitation light 31 into fluorescence or phosphorescence having longer wavelengths than the excitation light 31 and emits the fluorescence or phosphorescence. The second wavelength conversion layer 202 converts the excitation light 31 into fluorescence or phosphorescence having longer wavelengths than the excitation light 31 and emits the fluorescence or phosphorescence. The first light 32 emitted from the wavelength conversion member 20 includes the fluorescence or phosphorescence from the first wavelength conversion layer 201 and the fluorescence or phosphorescence from the second wavelength conversion layer 202. The second wavelength conversion layer 202 also emits the diffusively reflected light 33 having the same wavelength as the excitation light 31. It is thus possible to adjust the color of light emitted from the wavelength conversion member 20 by changing the thickness of the second wavelength conversion layer 202 to change the mixing ratio of the first light 32 to the diffusively reflected light 33.

In the case where the volume ratio of the second phosphor 26 in the second wavelength conversion layer 202 is higher than the volume ratio of the first phosphor 25 in the first wavelength conversion layer 201, the amount of fluorescence or phosphorescence emitted from the second phosphor 26 varies significantly depending on the thickness of the second wavelength conversion layer 202 because the excitation light 31 is first incident on the second wavelength conversion layer 202. Thus, the color of light emitted from the wavelength conversion member 20 varies easily depending on a slight change in the thickness of the second wavelength conversion layer 202. The volume ratio of the first inorganic particles 27 in the second wavelength conversion layer 202 is not particularly limited and may be adjusted in response to the color of light obtained by combining the first light 32 with the diffusively reflected light 33 originating from the excitation light 31.

The reflective layer 203 at least contains second inorganic particles 28 and a third matrix 24 and is located at least one side face 202c located between the first main surface 202a and the second main surface 202b of the second wavelength conversion layer 202. The reflective layer 203 in this embodiment is in contact with the side face 202c of the second wavelength conversion layer 202 and is located on the second main surface 201b of the first wavelength conversion layer 201. The second wavelength conversion layer 202 may have a circular shape, an elliptical shape, a triangular shape, a rectangular shape, or a polygonal shape in plan view (that is, when viewed from a direction perpendicular to the second main surface 202b). When the second wavelength conversion layer 202 has a circular shape or an elliptic shape in plan view, the second wavelength conversion layer 202 has a single side face. When the second wavelength conversion layer 202 has a triangular shape, a rectangular shape, or a polygonal shape, the second wavelength conversion layer 202 has a plurality of side faces.

The reflective layer 203 has the function of suppressing the emission of the first light 32 from a surface other than the surface of the second wavelength conversion layer 202 on which the excitation light 31 is incident to improve the contrast between the light-emitting portion and the non-light-emitting portion. The term "contrast" used here indicates the ratio of the luminance of the second wavelength conversion layer 202 serving as a light-emitting portion to the luminance of the reflective layer 203 serving as a non-light-emitting portion (the luminance of the light-emitting portion/the luminance of the non-light-emitting portion).

The material of the second inorganic particles 28 is preferably a transparent material that exhibits lower absorption of light in the visible region. Examples of the material of the second inorganic particles 28 may include $SiO_2$, $Al_2O_3$, MgO, ZnO, $TiO_2$, ZrO, $Ta_2O_5$, $Nb_2O_5$, BN, AlN, and $BaSO_4$. For example, the material of the second inorganic particles 28 in this embodiment is $TiO_2$. Examples of the third matrix 24 may include transparent inorganic materials, such as glass, silicone resins, organic-inorganic hybrid materials, $Al_2O_3$, and ZnO. For example, the third matrix 24 in this embodiment is a silicone resin having a siloxane bond.

When polysilsesquioxane is used as the third matrix 24, the second inorganic particles 28 may be sealed by, for example, the following method: (1) the polysilsesquioxane that has been dissolved in a benzyl alcohol solvent and the second inorganic particles 28 are mixed together into a paste-like mixture; and (2) the paste-like mixture is applied by, for example, a screen printing method to the first wavelength conversion layer 201 and thermally cured. Thereby, the third matrix 24 including the second inorganic particles 28 sealed therein is formed.

The volume ratio of the first phosphor 25 in the first wavelength conversion layer 201 is higher than the volume ratio of the second phosphor 26 in the second wavelength conversion layer 202 in the first embodiment of the present disclosure as described above. Thus, a main source of heat generated in the wavelength conversion member 20 during wavelength conversion is the first wavelength conversion layer 201. The contact area among particles of the first phosphor 25 in the first wavelength conversion layer 201 is larger than the contact area among particles of the second phosphor 26 in the second wavelength conversion layer 202. In addition, the first wavelength conversion layer 201 is in contact with the substrate 21. This enables efficient dissipation of heat generated during wavelength conversion, thereby suppressing a reduction in luminous efficiency. The volume ratio of the second phosphor 26 in the second wavelength conversion layer 202 is lower than the volume ratio of the first phosphor 25 in the first wavelength conversion layer 201. In addition, the second wavelength conversion layer 202 contains the first inorganic particles 27. The ratio of the first light 32 to the diffusively reflected light 33 originating from the excitation light 31 varies depending on the thickness of the second wavelength conversion layer 202. This enables control of the color of light emitted. The reflective layer 203 suppresses the emission of the first light 32 from a surface other than the surface of the second wavelength conversion layer 202 on which the excitation light 31 is incident, thereby improving the contrast between the light-emitting portion and the non-light-emitting portion.

Second Embodiment

FIG. 2 schematically illustrates a structure of a light source 40 according to a second embodiment. The light source 40 at least includes a semiconductor light-emitting element 41 and a wavelength conversion member 50. The semiconductor light-emitting element 41 emits excitation light 61. The wavelength conversion member 50 receives the excitation light 61 and emits first light 62 having longer wavelengths than the excitation light 61. The first light 62 is fluorescence or phosphorescence. The semiconductor light-emitting element 41 may be formed of an LED, a superluminescent diode (SLD), a laser diode (LD), or the like. For example, the semiconductor light-emitting element 41 in this embodiment is an LD. The semiconductor light-emitting element 41 may be formed of a single LD or a plurality of LD's optically coupled. The semiconductor light-emitting element 41 emits, for example, blue light. As with the first embodiment, the light source 40 further includes an entrance optical system 42 that may be located in an optical path of the excitation light 61 emitted from the semiconductor light-emitting element 41. The entrance optical system 42 includes, for example, a lens, a mirror, an optical fiber, or any combination thereof.

The wavelength conversion member 50 includes a surface on which excitation light from the semiconductor light-emitting element 41 is incident, and emits the first light 62 having longer wavelengths than the excitation light 61 from the surface and diffusively reflected light 63 having the same wavelength as the excitation light 61 that has not been subjected to wavelength conversion. The wavelength conversion member 50 includes a first wavelength conversion layer 501 located on at least a substrate 51 and a second wavelength conversion layer 502 on the first wavelength conversion layer 501. The wavelength conversion member 50 further includes a reflective layer 503 located on a side face of the first wavelength conversion layer 501 and a side face of the second wavelength conversion layer 502.

The first wavelength conversion layer 501 includes a first main surface 501a, a second main surface 501b, and at least one side face 501c located between the first main surface 501a and the second main surface 501b. The first main surface 501a faces the substrate 51. The second main surface 501b is located opposite the first main surface 501a. The first wavelength conversion layer 501 at least contains a first phosphor 55 and a first matrix 52. The first wavelength conversion layer 501 has a main function of converting the excitation light 61 into the first light 62. The material composition of the first phosphor 55 is not particularly limited. For example, the first phosphor 55 in this embodiment is an $(Y_{1-y}Gd_y)_3(Al_{1-z}Ga_z)_5O_{12}:Ce^{3+}[0 \le y<1, 0 \le z<1]$ phosphor. The first matrix 52 may be a transparent inorganic material, for example, glass, a silicone resin, an organic-inorganic hybrid material, $Al_2O_3$, or ZnO. For example, the first matrix 52 in this embodiment is ZnO.

In the case where ZnO is used as the first matrix 52, the first phosphor 55 may be sealed by, for example, the following method: (1) ZnO seed crystals are formed by vacuum deposition on a portion of the substrate 51 where the first wavelength conversion layer 501 is to be formed, and then a layer consisting of the first phosphor 55 is formed by a casting method on the ZnO seed crystals; (2) the substrate 51 with the seed crystals and the layer consisting of the first phosphor 55 is immersed in an aqueous zinc nitrate (Zn $(NO_3)_2$) solution containing hexamethylenetetramine $(C_6H_{12}N_4)$; and (3) the temperature of the aqueous solution is set to 80° C. Thereby, ZnO is formed by liquid-phase deposition on a specific portion of the substrate 51 so as to surround the first phosphor 55 to form the first wavelength conversion layer 501. The ZnO serving as the first matrix 52 formed by this method has a thermal conductivity of 10 W/m·K.

The volume ratio of the first phosphor 55 in the first wavelength conversion layer 501 is 30% or more and 80% or less. For example, the volume ratio of the first phosphor 55 in the first wavelength conversion layer 501 is 50% in this embodiment. When the volume ratio of the first phosphor 55 in the first wavelength conversion layer 501 is 30% or more, the contact area among particles of the first phosphor 55 is large, so that thermal conduction between the particles occurs easily. Thus, heat generated during the wavelength conversion is sufficiently dissipated to the substrate 51 to inhibit an increase in the temperature of the wavelength conversion member 50, thereby inhibiting a reduction in luminous efficiency. When the volume ratio of the first phosphor 55 in the first wavelength conversion layer 501 is 80% or less, the breaking or the like of the particles of the first phosphor 55 is inhibited. Thus, a reduction in luminous efficiency due to defects caused by the break is inhibited.

The first wavelength conversion layer 501 may contain inorganic particles, for example, $SiO_2$, $Al_2O_3$, or MgO, in a proportion lower than the volume ratio of the first phosphor 55, in addition to the first phosphor 55 and the first matrix 52. In this case, the scattering of the excitation light 61 and the first light 62 can be controlled.

The second wavelength conversion layer 502 includes a first main surface 502a, a second main surface 502b, and at least one side face 502c located between the first main surface 502a and the second main surface 502b. The first main surface 502a faces the second main surface 501b of the first wavelength conversion layer 501. The second main surface 502b is located opposite the first main surface 502a. The second wavelength conversion layer 502 at least contains a second phosphor 56, first inorganic particles 57, and a second matrix 53. The second phosphor 56 partially converts the excitation light 61 into the first light 62. The first inorganic particles 57 have a function of generating the diffusively reflected light 63 having the same wavelength as the excitation light 61.

The material composition of the second phosphor 56 is not particularly limited and may be a different composition from that of the first phosphor 55. For example, the second phosphor 56 in this embodiment is a $(Sr_s,Ca_t)AlSiN:Eu^{2+}$ [$0 \le s < 1$, $0 \le t < 1$] phosphor. The material of the first inorganic particles 57 is preferably a transparent material that exhibits lower absorption of light in the visible region. Examples of the material of the first inorganic particles 57 may include $SiO_2$, $Al_2O_3$, MgO, ZnO, $TiO_2$, ZrO, $Ta_2O_5$, $Nb_2O_5$, BN, AlN, and $BaSO_4$. For example, the material of the first inorganic particles 57 in this embodiment is $SiO_2$. Examples of the second matrix 53 may include transparent inorganic materials, such as glass, silicone resins, organic-inorganic hybrid materials, $Al_2O_3$, and ZnO. For example, the second matrix 53 in this embodiment is a polysilsesquioxane, which is an organic-inorganic hybrid material having a siloxane bond.

When the polysilsesquioxane is used as the second matrix 53, the second phosphor 56 and the first inorganic particles 57 may be sealed by, for example, the following method: (1) the polysilsesquioxane that has been dissolved in a benzyl alcohol solvent, the second phosphor 56, and the first inorganic particles 57 are mixed together into a paste-like mixture; and (2) the paste-like mixture is applied by, for example, a screen printing method to the first wavelength conversion layer 501 and thermally cured. Thereby, the second matrix 53 including the second phosphor 56 and the first inorganic particles 57 sealed therein is formed. The polysilsesquioxane serving as the second matrix 53 formed by this method has a thermal conductivity of 1 W/m·K.

The volume ratio of the second phosphor 56 in the second wavelength conversion layer 502 is preferably lower than that of the first phosphor 55 in the first wavelength conversion layer 501. More preferably, the volume ratio of the second phosphor 56 in the second wavelength conversion layer 502 is 0.1% or more and 20% or less. The volume ratio of the second phosphor 56 in the second wavelength conversion layer 502 may be, for example, 10%.

As with the first embodiment, the first wavelength conversion layer 501 converts the excitation light 61 into fluorescence or phosphorescence having longer wavelengths than the excitation light 61 and emits the fluorescence or phosphorescence. The second wavelength conversion layer 502 converts the excitation light 61 into fluorescence or phosphorescence having longer wavelengths than the excitation light 61 and emits the fluorescence or phosphorescence. The first light 62 emitted from the wavelength conversion member 50 includes the fluorescence or phosphorescence from the first wavelength conversion layer 501 and the fluorescence or phosphorescence from the second wavelength conversion layer 502. The second wavelength conversion layer 502 also emits the diffusively reflected light 63 having the same wavelength as the excitation light 61. It is thus possible to adjust the color of light emitted from the wavelength conversion member 50 by changing the thickness of the second wavelength conversion layer 502 to change the mixing ratio of the first light 62 to the diffusively reflected light 63.

In the case where the volume ratio of the second phosphor 56 in the second wavelength conversion layer 502 is higher than volume ratio of the first phosphor 55 in the first wavelength conversion layer 501, the amount of the first light 62 emitted from the second phosphor 56 varies significantly depending on the thickness of the second wavelength conversion layer 502 because the excitation light 61 is first incident on the second wavelength conversion layer 502. Thus, the color of light emitted from the wavelength conversion member 50 varies easily depending on a slight change in the thickness of the second wavelength conversion layer 502. The volume ratio of the first inorganic particles 57 in the second wavelength conversion layer 502 is not particularly limited and may be adjusted in response to the color of light obtained by combining the first light 62 with the diffusively reflected light 63 originating from the excitation light 61.

The reflective layer 503 at least contains second inorganic particles 58 and a third matrix 54 and is located on the side face 501c of the first wavelength conversion layer 501 and the side face 502c of the second wavelength conversion layer 502. The reflective layer 503 in this embodiment is in contact with the side face 501c of the first wavelength conversion layer 501 and the side face 502c of the second wavelength conversion layer 502 and is located on the substrate 51. Each of the first wavelength conversion layer 501 and the second wavelength conversion layer 502 may have a circular shape, an elliptical shape, a triangular shape, a rectangular shape, or a polygonal shape in plan view (that is, when viewed from a direction perpendicular to the second main surface 502b). When each of the first wavelength conversion layer 501 and the second wavelength conversion layer 502 has a circular shape or an elliptic shape in plan view, each has a single side face. When each of the first wavelength conversion layer 501 and the second wavelength conversion layer 502 has a triangular shape, a rectangular shape, or a polygonal shape, each has a plurality of side faces. The shape of the first wavelength conversion layer 501 and the shape of the second wavelength conversion layer 502 in plan view may be the same or different.

The reflective layer 503 has a function of suppressing the emission of the first light 62 from a surface other than the surface of the second wavelength conversion layer 502 on which the excitation light 61 is incident to improve the contrast between the light-emitting portion and the non-light-emitting portion. The material of the second inorganic particles 58 is preferably a transparent material that exhibits lower absorption of light in the visible region. Examples of the material of the second inorganic particles 58 may include $SiO_2$, $AL_2O_3$, MgO, ZnO, $TiO_2$, ZrO, $Ta_2O_5$, $Nb_2O_5$, BN, AlN, and BaSO$_4$. For example, the material of the second inorganic particles 58 in this embodiment is TiO$_2$. Examples of the third matrix 54 may include transparent inorganic materials, such as glass, silicone resins, organic-inorganic hybrid materials, Al$_2$O$_3$, and ZnO. For example, the third matrix 54 in this embodiment is a silicone resin having a siloxane bond.

When the silicone resin is used as the third matrix 54, the second inorganic particles 58 may be sealed by, for example, the following method: (1) the uncured silicone resin and the second inorganic particles 58 are mixed together into a paste-like mixture; and (2) the paste-like mixture is applied by, for example, a screen printing method only to the substrate 51 and thermally cured. Thereby, the third matrix 54 including the second inorganic particles 58 sealed therein is formed.

The volume ratio of the first phosphor 55 in the first wavelength conversion layer 501 is higher than the volume ratio of the second phosphor 56 in the second wavelength conversion layer 502 in the second embodiment of the present disclosure as described above. Thus, a main source of heat generated in the wavelength conversion member 50 during wavelength conversion is the first wavelength conversion layer 501. The contact area among particles of the first phosphor 55 in the first wavelength conversion layer 501 is larger than the contact area among particles of the second phosphor 56 in the second wavelength conversion layer 502. In addition, the first wavelength conversion layer 501 is in contact with the substrate 51. This enables efficient dissipation of heat generated during wavelength conversion, thereby suppressing a reduction in luminous efficiency. The volume ratio of the second phosphor 56 in the second wavelength conversion layer 502 is lower than the volume ratio of the first phosphor 55 in the first wavelength conversion layer 501. In addition, the second wavelength conversion layer 502 contains the first inorganic particles 57. The ratio of the first light 62 to the diffusively reflected light 63 originating from the excitation light 61 varies depending on the thickness of the second wavelength conversion layer 502. This enables easy control of the color of light emitted. In particular, the first phosphor 55 and the second phosphor 56 have different material compositions in the second embodiment of the present disclosure. This results in different light colors and enables appropriate control of a mixed color obtained by the combination of at least three colors: the color of the diffusively reflected light 63 originating from the excitation light 61, the color of light emitted from the first phosphor, and the color of light emitted from the second phosphor. The reflective layer 503 suppresses the emission of the first light 62 from a surface other than the surface of the second wavelength conversion layer 502 on which the excitation light 61 is incident to improve the contrast between the light-emitting portion and the non-light-emitting portion.

Third Embodiment

FIG. 3 schematically illustrates a structure of a vehicle headlamp 120 according to a third embodiment of the present disclosure. The vehicle headlamp 120 in this embodiment includes the light source 10 in the first embodiment or the light source 40 in the second embodiment; and an exit optical system 122 that guides light from the light source toward the front. To adjust the color of light emitted, a wavelength cutoff filter 121 that partially absorbs or reflects light from the light source may be provided. The exit optical system 122 guides light from the light source 10 or the light source 40 to the outside. The exit optical system 122 is, for example, a projection lens. The vehicle headlamp 120 may be what is called a projector-type vehicle headlamp or a reflector-type vehicle headlamp. The term "vehicle" used in the present disclosure includes automobiles, two-wheeled vehicles, and special-purpose vehicles.

The vehicle headlamp according to the third embodiment provides the same advantageous effects as those obtained in the first or second embodiment. In particular, the vehicle headlamp 120 emits a high-contrast light beam even when the state of collection of light emitted from the light source 10 or 40 is adjusted with the projection lens because of the improved contrast between the light-emitting portion an the non-light-emitting portion of the light source 10 or 40.

Fourth Embodiment

Figure 4:
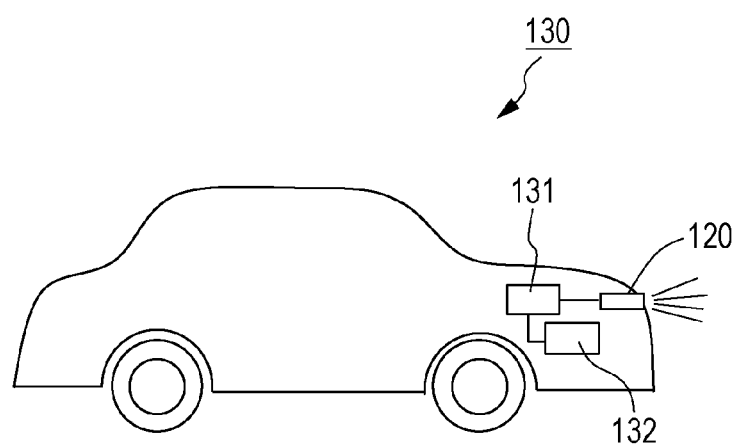
FIG. 4 schematically illustrates a structure of a vehicle according to a fourth embodiment.

FIG. 4 schematically illustrates a structure of a vehicle 130 according to a fourth embodiment of the present disclosure. The vehicle 130 includes the vehicle headlamp 120 according to the third embodiment and a power supply source 131. The vehicle 130 may include a generator 132 that is rotationally driven by a driving source such as an engine to generate electric power. The electric power generated by the generator 132 is stored in the power supply source 131. The power supply source 131 is, for example, a secondary battery that can be charged and discharged. The vehicle headlamp 120 is operated by electric power from the power supply source 131. Examples of the vehicle 130 include automobiles, two-wheeled vehicles, and special-purpose vehicles. The vehicle 130 may be an engined vehicle, an electric vehicle, or a hybrid electric vehicle.

The vehicle according to the fourth embodiment also provides the same advantageous effects as those obtained in the first or second embodiment.

The wavelength conversion member according to an embodiment of the present disclosure is usable for light sources, such as special lighting devices, head-up displays, projectors, and vehicle headlamps.

What is claimed is:
1. A wavelength conversion member, comprising:
   a substrate;
   a first wavelength conversion layer on the substrate, the first wavelength conversion layer containing a first phosphor and a first matrix; and
   a second wavelength conversion layer having: a first main surface facing the first wavelength conversion layer; and a second main surface on which excitation light from a semiconductor light-emitting element is incident, the second wavelength conversion layer containing a second phosphor, first inorganic particles, and a second matrix, wherein
   the first phosphor and the second phosphor convert at least part of the excitation light incident on the second main surface into first light having longer wavelengths than the excitation light,
   the first light is emitted from the second main surface of the second wavelength conversion layer, and
   a volume Vp1 of the first phosphor, a volume Vw1 of the first wavelength conversion layer, a volume Vp2 of the second phosphor, and a volume Vw2 of the second wavelength conversion layer satisfy Vp1/Vw1>Vp2/Vw2.
2. The wavelength conversion member according to claim 1, further comprising:

a reflective layer on at least one side face of the second wavelength conversion layer, the reflective layer containing:
  second inorganic particles; and
  a third matrix.

3. The wavelength conversion member according to claim 1, wherein the volume Vp1 of the first phosphor is equal to or more than 30% and less than or equal to 80% of the volume Vw1 of the first wavelength conversion layer.

4. The wavelength conversion member according to claim 1, wherein the volume Vp2 of the second phosphor is equal to or more than 0.1% and less than or equal to 20% of the volume Vw2 of the second wavelength conversion layer.

5. The wavelength conversion member according to claim 1, wherein the first matrix has a higher thermal conductivity than the second matrix.

6. The wavelength conversion member according to claim 1, wherein the first matrix is zinc oxide.

7. The wavelength conversion member according to claim 1, wherein the second matrix is a material having a siloxane bond.

8. A light source, comprising:
  a semiconductor light-emitting element that emits excitation light having a peak wavelength of 420 nm or more and 470 nm or less; and
  a wavelength conversion member including:
    a substrate;
    a first wavelength conversion layer on the substrate, the first wavelength conversion layer containing a first phosphor and a first matrix; and
    a second wavelength conversion layer having: a first main surface facing the first wavelength conversion layer; and a second main surface on which excitation light from a semiconductor light-emitting element is incident, the second wavelength conversion layer containing a second phosphor, first inorganic particles, and a second matrix, wherein
  the first phosphor and the second phosphor convert at least part of the excitation light incident on the second main surface into first light having longer wavelengths than the excitation light,
  the first light is emitted from the second main surface of the second wavelength conversion layer, and
  a volume Vp1 of the first phosphor, a volume Vw1 of the first wavelength conversion layer, a volume Vp2 of the second phosphor, and a volume Vw2 of the second wavelength conversion layer satisfy Vp1/Vw1>Vp2/Vw2.

9. The light source according to claim 8, further comprising:
  a reflective layer on at least one side face of the second wavelength conversion layer, the reflective layer containing:
    second inorganic particles; and
    a third matrix.

10. The light source according to claim 8, wherein the volume Vp1 of the first phosphor is equal to or more than 30% and less than or equal to 80% of the volume Vw1 of the first wavelength conversion layer.

11. The light source according to claim 8, wherein the volume Vp2 of the second phosphor is equal to or more than 0.1% and less than or equal to 20% of the volume Vw2 of the second wavelength conversion layer.

12. The light source according to claim 8, wherein the first matrix has a higher thermal conductivity than the second matrix.

13. The light source according to claim 8, wherein the first matrix is zinc oxide.

14. The light source according to claim 8, wherein the second matrix is a material having a siloxane bond.

15. A vehicle headlamp, comprising:
  a light source including a wavelength conversion member and a semiconductor light-emitting element that emits excitation light having a peak wavelength of 420 nm or more and 470 nm or less; and
  an exit optical system that guides light from the light source to the outside,
  the wavelength conversion member including:
    a substrate;
    a first wavelength conversion layer on the substrate, the first wavelength conversion layer containing a first phosphor, and a first matrix; and
    a second wavelength conversion layer having: a first main surface facing the first wavelength conversion layer; and a second main surface on which excitation light from a semiconductor light-emitting element is incident, the second wavelength conversion layer containing a second phosphor, first inorganic particles, and a second matrix, wherein
  the first phosphor and the second phosphor converting at least part of the excitation light incident on the second main surface into first light having longer wavelengths than the excitation light,
  the first light is emitted from the second main surface of the second wavelength conversion layer, and
  a volume Vp1 of the first phosphor, a volume Vw1 of the first wavelength conversion layer, a volume Vp2 of the second phosphor, and a volume Vw2 of the second wavelength conversion layer satisfy Vp1/Vw1>Vp2/Vw2.

16. The vehicle headlamp according to claim 15, further comprising:
  a reflective layer on at least one side face of the second wavelength conversion layer, the reflective layer containing:
    second inorganic particles; and
    a third matrix.

17. The vehicle headlamp according to claim 15, wherein the volume Vp1 of the first phosphor is equal to or more than 30% and less than or equal to 80% of the volume Vw1 of the first wavelength conversion layer.

18. The vehicle headlamp according to claim 15, wherein the volume Vp2 of the second phosphor is equal to or more than 0.1% and less than or equal to 20% of the volume Vw2 of the second wavelength conversion layer.

19. The vehicle headlamp according to claim 15, wherein the first matrix has a higher thermal conductivity than the second matrix.

20. The vehicle headlamp according to claim 15, wherein the first matrix is zinc oxide.

* * * * *